US005821815A

United States Patent [19]

Mohwinkel

[11] Patent Number: 5,821,815

[45] Date of Patent: Oct. 13, 1998

[54] MINIATURE ACTIVE CONVERSION BETWEEN SLOTLINE AND COPLANAR WAVEGUIDE

[75] Inventor: Clifford A. Mohwinkel, San Jose, Calif.

[73] Assignee: Endgate Corporation, Sunnyvale, Calif.

[21] Appl. No.: 719,860

[22] Filed: Sep. 25, 1996

[51] Int. Cl.[6] ....... H03F 3/60

[52] U.S. Cl. ....... 330/286; 330/301; 333/26

[58] Field of Search ....... 333/26, 33, 247; 330/286, 301

[56] References Cited

U.S. PATENT DOCUMENTS

| | | | |
|---|---|---|---|
| 4,097,814 | 6/1978 | Cohn | 330/286 |
| 4,587,541 | 5/1986 | Dalman et al. . | |
| 4,864,645 | 9/1989 | Dixon, Jr. et al. | 455/327 |
| 4,906,953 | 3/1990 | Li et al. | 333/33 |
| 5,087,896 | 2/1992 | Wen et al. | 331/99 |
| 5,115,245 | 5/1992 | Wen et al. | 342/175 |
| 5,194,833 | 3/1993 | Dougherty et al. | 333/33 |
| 5,227,738 | 7/1993 | Shiga | 330/307 |
| 5,266,963 | 11/1993 | Carter | 343/850 |
| 5,352,998 | 10/1994 | Tanino | 333/247 |
| 5,428,327 | 6/1995 | Bahl | 333/246 |
| 5,491,449 | 2/1996 | Johnson et al. | 330/269 |
| 5,528,203 | 6/1996 | Mohwinkel et al. | 333/128 |
| 5,550,518 | 8/1996 | Mohwinkel | 333/33 |
| 5,610,563 | 3/1997 | Mohwinkel | 333/26 X |

FOREIGN PATENT DOCUMENTS

| | | | |
|---|---|---|---|
| 0 358 497 A2 | 3/1990 | European Pat. Off. . | |
| 0 358 497 A3 | 3/1990 | European Pat. Off. . | |
| 0 627 765 A1 | 12/1994 | European Pat. Off. . | |
| 41 28334 A1 | 3/1993 | Germany . | |
| 60-153602 | 8/1985 | Japan | 333/26 |
| 63-240102 | 10/1988 | Japan . | |

OTHER PUBLICATIONS

M. Aikawa et al., "MMIC Progress in Japan", *IEEE 1989 Microwave and Millimeter–Wave Monolithic Circuits Symposium Digest of Papers*, Jun. 12–13, 1989, Long Beach, California, pp. 1–6.

A T R Koudenpa Tsushin Kenkyusho: KK, "Microwave Line Converter", *Patent Abstracts of Japan*, vol. 13, No. 46 (E–711), 2 Feb. 1989 & JP–A–63 240102), 5 Oct. 1988, abstract.

Nippon Telegr & Teleph Corp <NTT>, "Transmission Line Mode Converter", *Patent Abstracts of Japan*, vol. 13, No. 176 (E–749), 25 Apr. 1989 & JP–A–01 005102), 10 Jan. 1989, abstract.

Nippon Denshin Denwa Kosha, "Converting Circuit of Coplanar Line and Slot Line", *Patent Abstracts of Japan*, vol. 9, No. 321 (E367) [2044], 17 Dec. 1985, & JP–A–60 153602), 13 Aug. 1985, abstract.

Nakamura et al., "Over–30–GHz Limiting Amplifier IC's with Small Phase Deviation for Optical Communication Systems", IEEE Journal Solid–State Circuits, vol. 31, No. 8, Aug. 1996, pp. 1091–1099.

*Primary Examiner*—Paul Gensler
*Attorney, Agent, or Firm*—Edward B. Anderson

[57] ABSTRACT

An active device, such as a field effect transistor ("FET"), converts microwave signals between a slot transmission line ("slotline") and a coplanar waveguide ("CPW") In slotline-to-CPW conversion using one or more FETs, a gate connection is made to one or both of the slotline conductors. A drain connection is made to the center conductor on the CPW. Two FET source terminals are connected respectively to each CPW ground strip and may be coupled to a slotline conductor. The active device can be reconnected so as to reverse the input and output, providing for conversion of signals from CPW to slotline. Conversion between balanced-signal slotline and CPW further includes passive or active phase shift of one signal path.

21 Claims, 6 Drawing Sheets

MINIATURE ACTIVE CONVERSION BETWEEN SLOTLINE AND COPLANAR WAVEGUIDE

FIELD OF THE INVENTION

The present invention relates to the field of microwave and millimeter wave signal circuits, and in particular to conversions between slotline and coplanar waveguide transmission lines.

BACKGROUND OF THE INVENTION

Slotlines and coplanar waveguides are each generally preferred modes of signal transmission for different types of circuits and applications. A slotline consists of a pair of opposing coplanar conductors mounted on a face of a substrate. Slotlines may be used for transmitting unbalanced signals, but are most commonly used to carry balanced signals for processing in balanced circuits, such as push-pull amplifiers and mixers.

Push-pull amplifiers, in particular, provide higher gain than a common-reference amplifier due to lower common lead inductance. The overall efficiency of a push-pull amplifier can be higher, and the higher gain supplied by each amplifier stage enables circuit designers to employ fewer stages to achieve a given level of gain. Compared to other types of amplifiers, push-pull amplifiers also offer the desirable characteristics of higher input and output impedance. These features result in lower loss due to relatively lower transformation ratios, improved efficiency and greater bandwidth. Such advantages are representative of the benefits gained from use of slot line circuits.

A coplanar waveguide, having a central signal conductor between two opposing and coplanar common or ground conductors, is also useful for microwave and millimeter wave circuits for transmitting microwave signals over a single face of a substrate. Like slotlines, coplanar waveguides are particularly useful because both signal and ground conductors are on a single, common plane and are directly accessible by devices exposed to the same plane. For instance, coplanar waveguides are known to be used to connect different flip-mounted circuits. Flip mountings produce less common lead and parasitic inductance than other mounting methods.

As a result of the benefits obtained from slotlines and coplanar waveguides, there are situations where it is desirable to transition between a slotline and a coplanar waveguide, either from a slotline to a coplanar waveguide or from a coplanar waveguide to a slotline. Connecting a slotline transmission line to a coplanar waveguide in the usual, passive way introduces reflections and loss due to the fact that the conversion usually takes at least one quarter wavelength of transmission line to achieve. It is desirable to "launch" a microwave signal between a slotline and a coplanar waveguide with no loss of gain and compensation for change in traveling wave mode. It would be further desirable if such connection could be in the form of a monolithic integrated circuit, occupying a small space with few parts and therefore costing less to produce than current connection methods.

SUMMARY OF THE INVENTION

The present invention provides a small, easily implemented active "launch" or conversion between a slotline and a coplanar waveguide that is economical and may readily be implemented in a form having a small size. Active conversion between slotline mode and coplanar waveguide mode offers the circuit designer the advantages of incorporating amplification into the conversion to thereby make both types of transmission lines available, thereby reducing the need for amplification otherwise. An active device is a circuit containing one or more active elements, such as transistors. An active device may or may not include passive elements as well.

An apparatus according to the present invention includes an active device having one or more active elements, such as a bipolar junction transistor or a field effect transistor, and which may include passive elements. The active device converts a microwave or millimeter wave signal conducted by a slotline to a signal conducted by a coplanar waveguide, or conversely converts a signal conducted by a coplanar waveguide to one conducted by a slotline.

More specifically, such an apparatus made according to the invention includes an insulating substrate having a planar face, and a slotline consisting of a pair of opposing coplanar conductors mounted on the face of the substrate. A coplanar waveguide has a center conductor and an associated coplanar ground conductor on each side of the center conductor. An active device has an input terminal, an output terminal, and one or more common terminals. This device is mounted adjacent to the substrate with the input terminal and the output terminal each coupled to a different respective one of the signal conductors of the coplanar waveguide and one of the opposing conductors of the slotline. The common terminal is coupled to one of the ground conductors. The active device couples a signal between the slotline and the coplanar waveguide.

In a relatively simple embodiment of this invention, the active device is a single field effect transistor flip mounted on the adjacent ends of slotline and coplanar waveguide conductors. One ground conductor of the coplanar waveguide is integral with one of the opposing slotline conductors.

A more complicated exemplary preferred embodiment of the invention includes a first active device having an input terminal coupled to the center conductor of the coplanar waveguide, and first and second output terminals, and a second active device having first and second input terminals coupled respectively to the first and second output terminals of the first active device. The first and second output terminals are coupled individually to the opposing conductors of an output slotline. The first active device comprises a first field effect transistor, and the second active device comprises second and third field effect transistors connected in direct-current series. The sources of the second and third field effect transistors are coupled together with a DC-blocking capacitor. The first transistor is biased separately from the second and third transistors, with direct current blocking capacitors separating them.

Other embodiments are also described in the following specification.

By constructing slotline/coplanar waveguide interfaces in this manner, the inductances common to the input and output of the active device is minimized. This active launch also can provide gain, reducing the need for down line amplifiers. The size of the launch is also reduced relative to passive launches. An appreciation of these and other advantages of the present invention and a more complete understanding of this invention may be achieved by studying the following description of preferred embodiments and the accompanying drawings.

DESCRIPTION OF PREFERRED EMBODIMENTS

Figure 1:
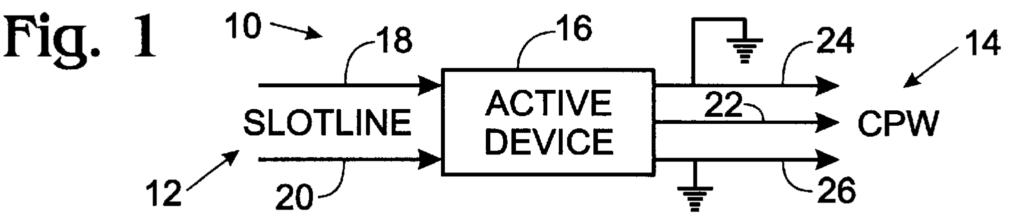
FIG. 1 is a general diagram showing conversion of a slotline to a coplanar waveguide using an active device according to the invention.
Figure 2:
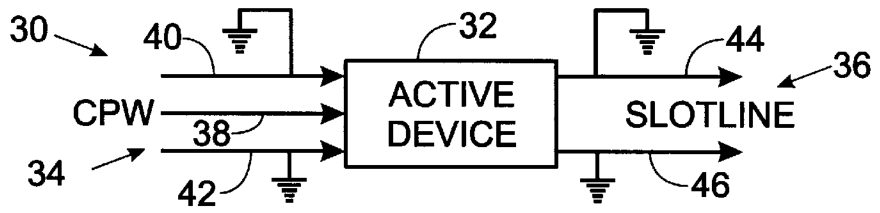
FIG. 2 is a diagram similar to FIG. 1 showing conversion of a coplanar waveguide to a slotline.

As has been mentioned, the invention provides for low-loss conversion between slotline and coplanar waveguide (CPW) transmission lines by the use of an active device at the interface. Such conversion can be from slotline to CPW or from CPW to slotline. The general concept of the invention is shown in FIGS. 1 and 2, with two basic embodiments shown in FIGS. 3 and 4. An active device typically has an input terminal, an output terminal, and a common terminal. When the active device is a transistor, the output terminal and common terminal are also referred to as current-carrying terminals, and the input terminal is referred to as a control terminal. An active device thus typically includes one or a combination of transistors, although other circuit elements may also be included, whether active or passive. Although the preferred form of the active elements in an active device according to the invention are shown herein as FETs, other forms of active elements, such as bipolar junction transistors, can also be used when the terminals are properly configured. An active device may include one or more chips mounted on a circuit board.

Figure 3:
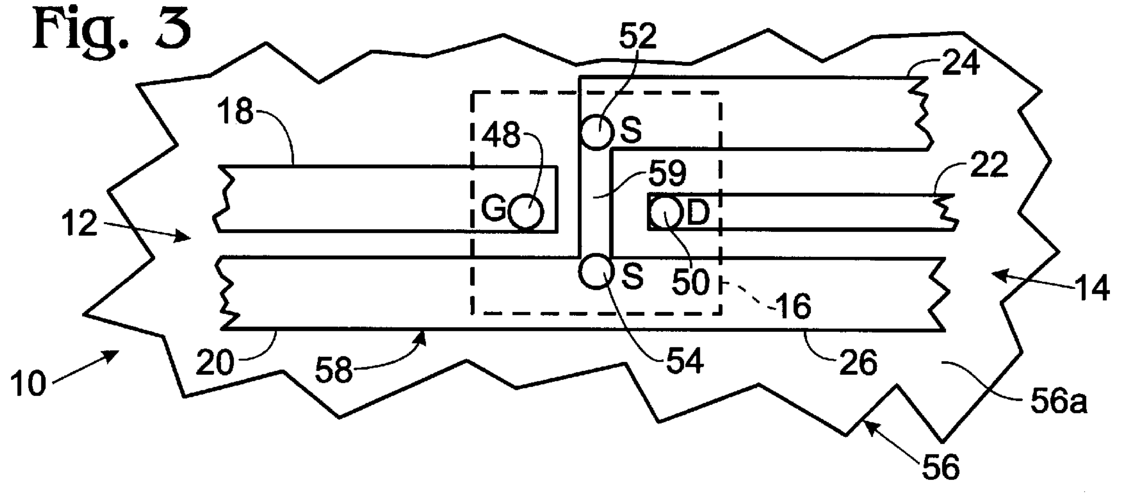
FIG. 3 is a plan view of the embodiment of FIG. 1 utilizing a FET as the active device flip-mounted on the two transmission lines.
Figure 4:
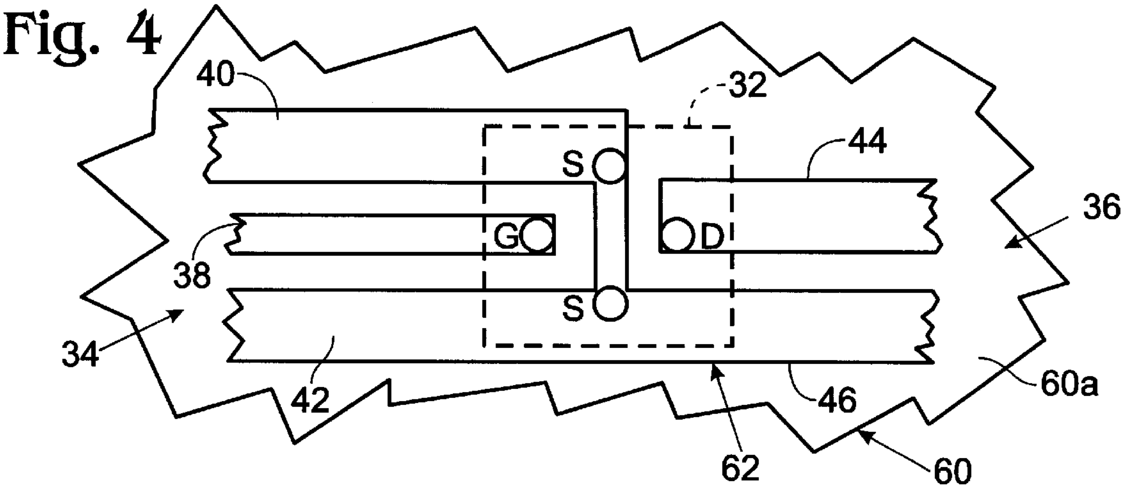
FIG. 4 is a plan view similar to FIG. 3 of the embodiment of FIG. 2.

In the embodiments illustrated, one or more field effect transistors (FETs) are used to form the active device. A common form of FET formed in a chip has opposing gate and drain terminals, and preferably an associated source terminal formed on each side of the gate and drain terminals, as shown in FIGS. 3 and 4. Although terminals, which provide external connections to the FET, can be configured in various ways, the bilateral symmetry shown falls out of the basic structure of the FET as well as the need to reduce common lead inductance by having more than one common terminal.

FIG. 1 illustrates an active launch 10 that converts a slotline 12 to a coplanar waveguide (CPW) 14 using an active device 16. Slotline 12 includes a pair of opposing coplanar conductors 18, 20. CPW 14 includes a central or signal conductor 22 spaced from and coplanar with opposite ground conductors 24, 26.

FIG. 2 illustrates a launch 30 that is the reverse of launch 10. That is, an active device 32 converts a CPW 34 to a slotline 36. CPW 34 includes signal conductor 38 and ground conductors 40, 42. Slotline 36 includes opposing conductors 44, 46.

FIG. 3 is a plan view of a circuit structure embodying launch 10 of FIG. 1. For ease of discussion, the same reference numbers are applied. Active device 16 is a FET having an input control or gate terminal 48, an output drain terminal 50, and two source terminals 52, 54. Device 16 is in the form of a chip with the terminals flip mounted onto slotline 12 and CPW 14 as shown. The transmission line conductors are mounted on a common face **56*a* of an insulating substrate 56 and are sized to provide impedance matching, as is well known in the art. Conductors 20 and 26 are integrally joined as a unitary conductor 58. Further, conductors 24 and 58 are preferably connected by a conductor section 59 extending between conductors 18 and 22 under device 16. In this embodiment, conductor 20 is at common potential, so the signal on remaining slotline conductor 18 is the control signal to FET 16 that produces an amplified signal on central CPW conductor 22**.

The transmission lines of launch 30 shown in FIG. 4 are a mirror image of the lines in FIG. 3. The FET forming active device 32 is mounted with the gate terminal on the input signal conductor 38 and the drain terminal on the output slotline conductor 44. The transmission lines are mounted on a face **60*a* of a substrate 60. Conductors 42 and 46 form a unitary conductor 62**.

Figure 5:
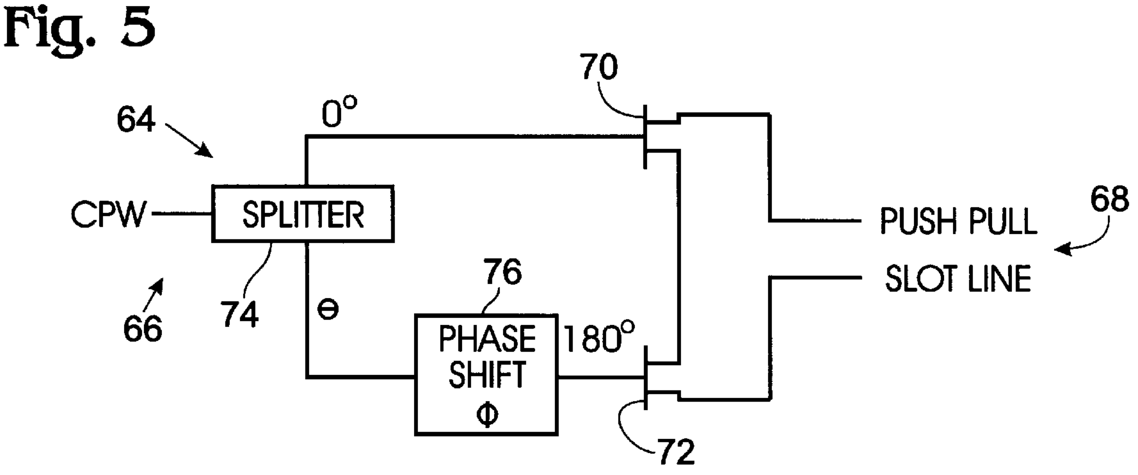
FIG. 5 is a general schematic of an embodiment of FIG. 2 for conversion from a coplanar waveguide to a push-pull slotline.
Figure 6:
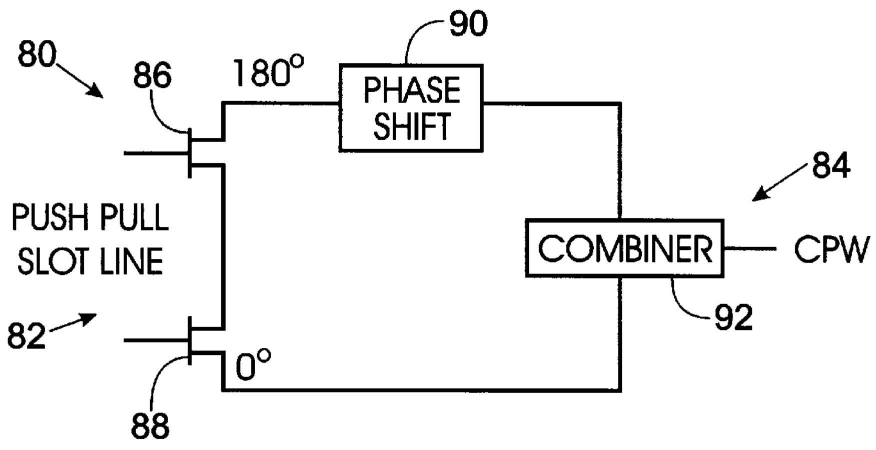
FIG. 6 is a general schematic similar to FIG. 5 of an embodiment of FIG. 1 for conversion from a push-pull slotline to a coplanar waveguide.

The signal on the slotlines in the embodiments of FIGS. 3 and 4 are balanced, since they are equal and opposite in polarity, as would be the case with balanced signals associated with a push-pull circuit. FIGS. 5 and 6 illustrate general schematics of conversions also involving balanced signals on push-pull slotlines.

FIG. 5 shows an active device in the form of an amplifier 64 driven by a single-ended signal on a CPW 66 and having a push-pull output on a slotline 68. Amplifier 64, which corresponds to active device 32, comprises a pair of push-pull-connected FETs 70, 72, a signal splitter 74, and a phase shifter 76. The splitter divides the input signal into two paths and in the process produces signals that are out of phase by an angle of θ relative to the other signal shown to have an angle of 0°. An angle θ of 0° corresponds to signal splitting with the two signals in phase. The phase shifter 76 is designed to produce a phase shift of ϕ, where θ+ϕ=180°.

FIGS. 6 shows an arrangement reverse to that of FIG. 5. The active device is an amplifier 80 receiving balanced inputs on a slotline 82 and outputting a single signal on a CPW 84. Amplifier 80 includes a pair of push-pull FETs 86, 88, and a phase shifter 90 that produces a phase shift complementary to a signal combiner 92.

Figure 7:
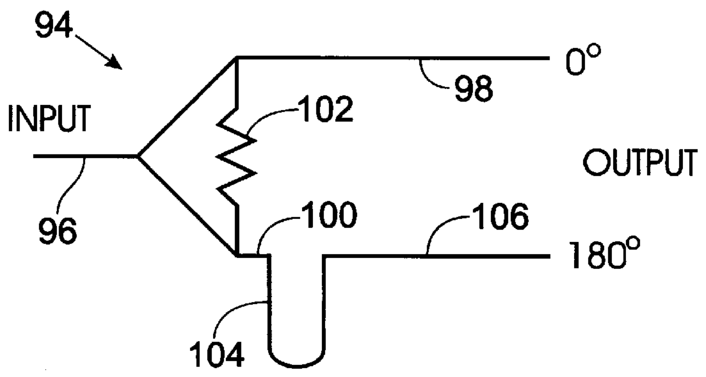
FIG. 7 is a schematic diagram illustrating a Wilkinson splitter for dividing a signal on a coplanar waveguide into two signal paths with phase shifting of the signal in one path, usable in the embodiments of FIGS. 5 and 6.

Many devices may be used for both signal combiners and splitters. For instance, FIG. 7 shows a Wilkinson divider 94 that divides an input signal on an input transmission line 96 into two signals of equal phase on lines 98, 100, i.e., θ=0°.

The isolation between these lines is improved by the use of a resistor 102 between them, as is well known in the art. A transmission line loop 104 adds 180° phase shift at the desired frequency to the signal on line 100, so that the signal on an output line 106 is 180° out of phase relative to the signal on line 98. This structure may be reversed to combine two balanced signals into a single signal.

Figure 8:
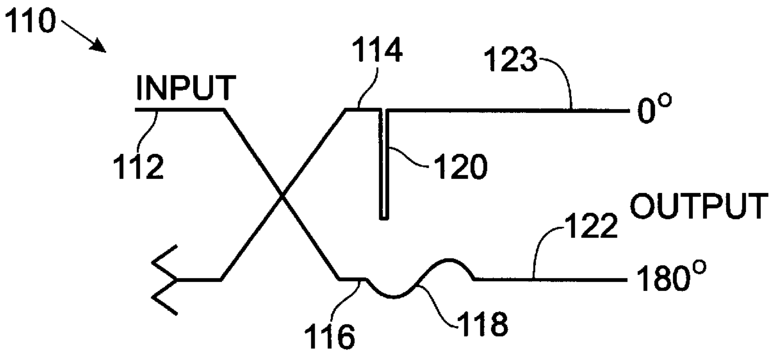
FIG. 8 is a schematic diagram of a quadrature coupler with a Schiffman phase shifter, also usable in the embodiments of FIGS. 5 and 6.

FIG. 8 illustrates the conversion of a single signal into balanced output signals using a quadrature coupler 110. As is well known in the art, a quadrature coupler divides a signal input on line 112 into two output signals on lines 114 and 116 that are about 90° out of phase. This phase shift is relatively frequency insensitive. A transmission line loop 118 provides an additional 90° phase shift that is frequently sensitive. A Schiffman equalizer 120 corrects the phase shift over the operating frequency, as is also known in the art, to produce an output signal on line 122 that is 180° out of phase relative to the signal on line 123. As with the Wilkinson divider, this structure may also be reversed to combine two balanced signals.

Figure 9:
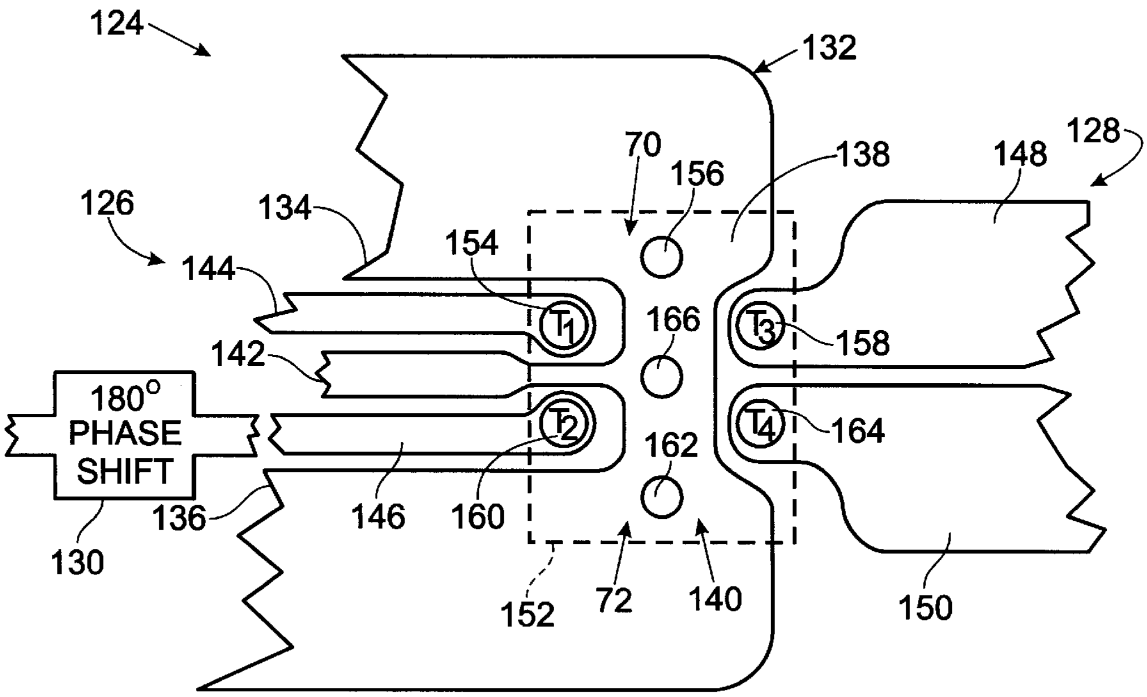
FIG. 9 is a plan view illustrating an embodiment of FIGS. 5 and 6.

FIG. 9 is a plan view of a launch 124 from a dual-CPW 126 to a slotline 128. This structure corresponds to a portion of amplifier 64 of FIG. 5, with the splitter omitted and the phase shifter represented by 180° phase shifter 130. CPW 126 includes ground metalization 132 that includes input ground conductors 134, 136, mounting portion 138 that extends through a connection region 140 between conductors 134 and 136, and an intermediate ground conductor 142 which separates the dual signal conductors 144, 146. Slotline 128 includes opposing conductors 148, 150.

FETs 70 and 72, not shown in FIG. 9, are formed in a chip 152, represented by the dashed line. This line also represents connection region 140 of the associated substrate, also not specifically identified, indicating the footprint of the chip. FET 70 includes a gate terminal 154, shown as terminal $T_1$, source terminal 156, and drain terminal 158, shown as terminal $T_3$. Similarly, FET 72 has a gate terminal 160, shown as terminal $T_2$, source terminal 162, and drain terminal 164, shown as terminal $T_4$. A common source terminal 166 is shared by both FETs.

As has been stated, in FIG. 9, the two gate terminals are represented by input terminals $T_1$ and $T_2$, and the two drain terminals are represented by output terminals $T_3$ and $T_4$. In order to realize the reverse circuit shown in FIG. 6, the gate terminals would be connected to terminals $T_3$ and $T_4$, and the drain terminals would be connected to terminals $T_1$ and $T_2$.

Figure 10:
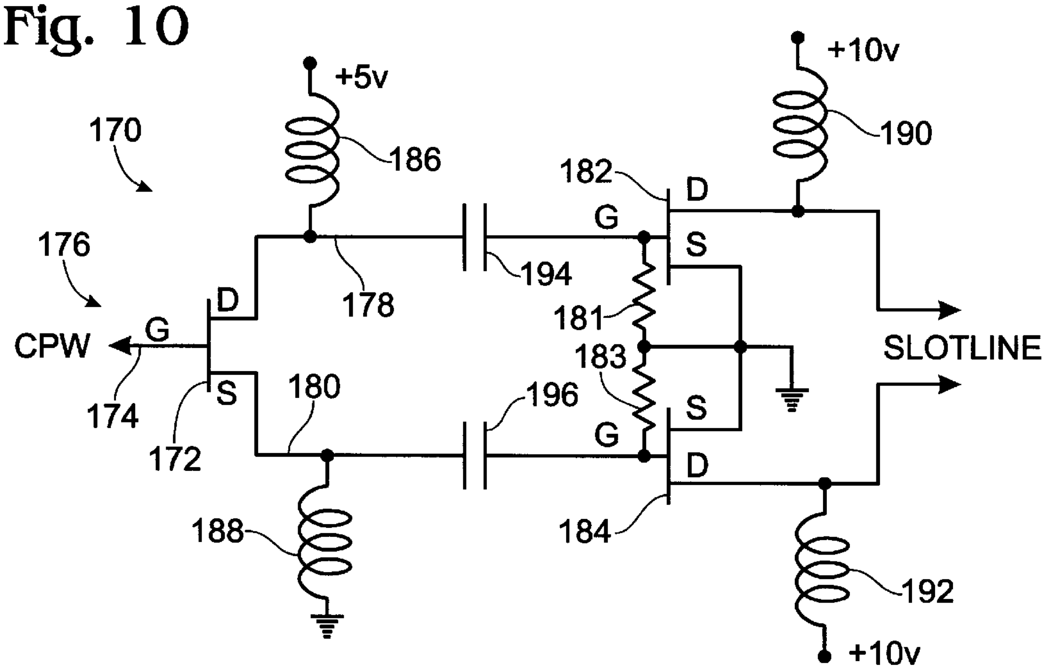
FIG. 10 is a schematic of an embodiment of the circuit of FIG. 5 in which signal splitting and phase shift are provided by a second active device connected by in-line capacitors to the first active device.

The circuits of FIGS. 5 and 9 are also realizable with an active phase shifter/splitter. This is shown in one form as a schematic in FIG. 10 by totally active launch 170. Launch 170 includes a single FET 172, the gate of which is driven by a signal conductor 174 of an input CPW 176. The drain and source are connected to intermediate conductors 178 and 180 which are coupled to the gates of FETs 182, 184. The gates of FETs 182, 184 are coupled to ground via resistors 181, 183. FET 172 is DC biased via bias inductors 186, 188. FETs 182 and 184 are similarly biased via bias inductors 190, 192. The separate bias voltages applied to FET 172 and to FETs 182, 184 are maintained by DC blocking capacitors 194, 196.

Figure 11:
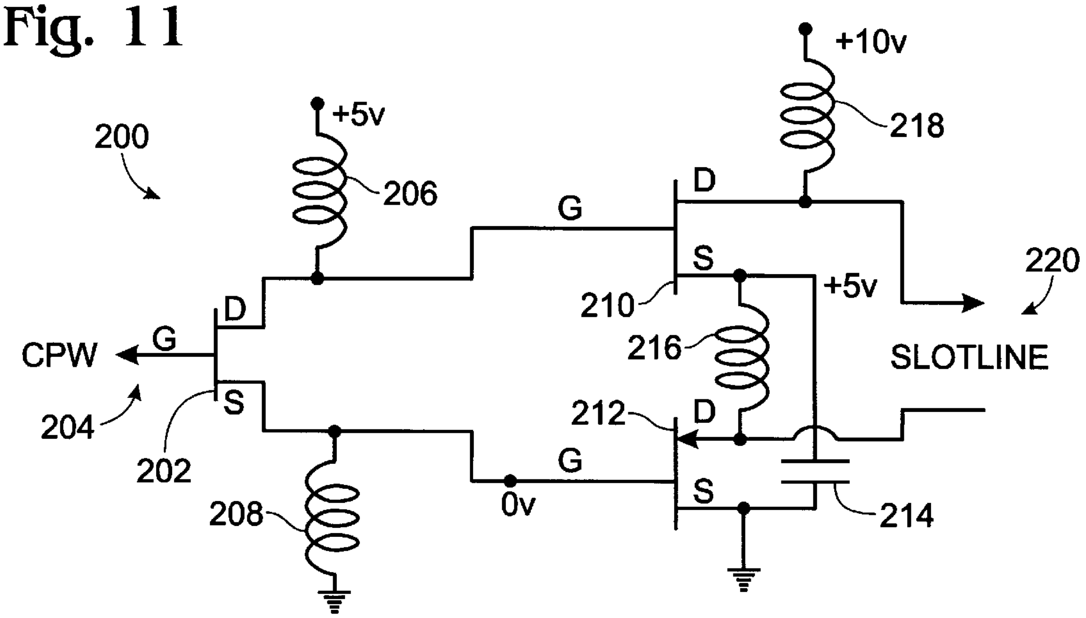
FIG. 11 is a schematic of an embodiment similar to FIG. 10 but without the in-line capacitors.

FIG. 11 illustrates an active launch 200 that is similar to launch 170, except that it is configured without the in-line DC-blocking capacitors. The front end is similar in that it has a splitter/phase shifter FET 202 having a gate connected to an input CPW 204, and a drain and a source biased via respective inductors 206, 208. The drain and source of FET 202 are connected directly to the gates of DC-series connected FETs 210,212.

The interaction of the respective biases is accommodated by the DC-series connection of FETs 210, 212. This is achieved by inserting a capacitor 214 between the sources, an inductor 216 between the source of FET 210 and the drain of FET 212, an inductor 218 between the drain of FET 210 and a reference voltage, and connection of the source of FET 212 to ground. As with launch 170, the outputs of FETs 210, 212 are applied to a slotline 220.

Figure 12:
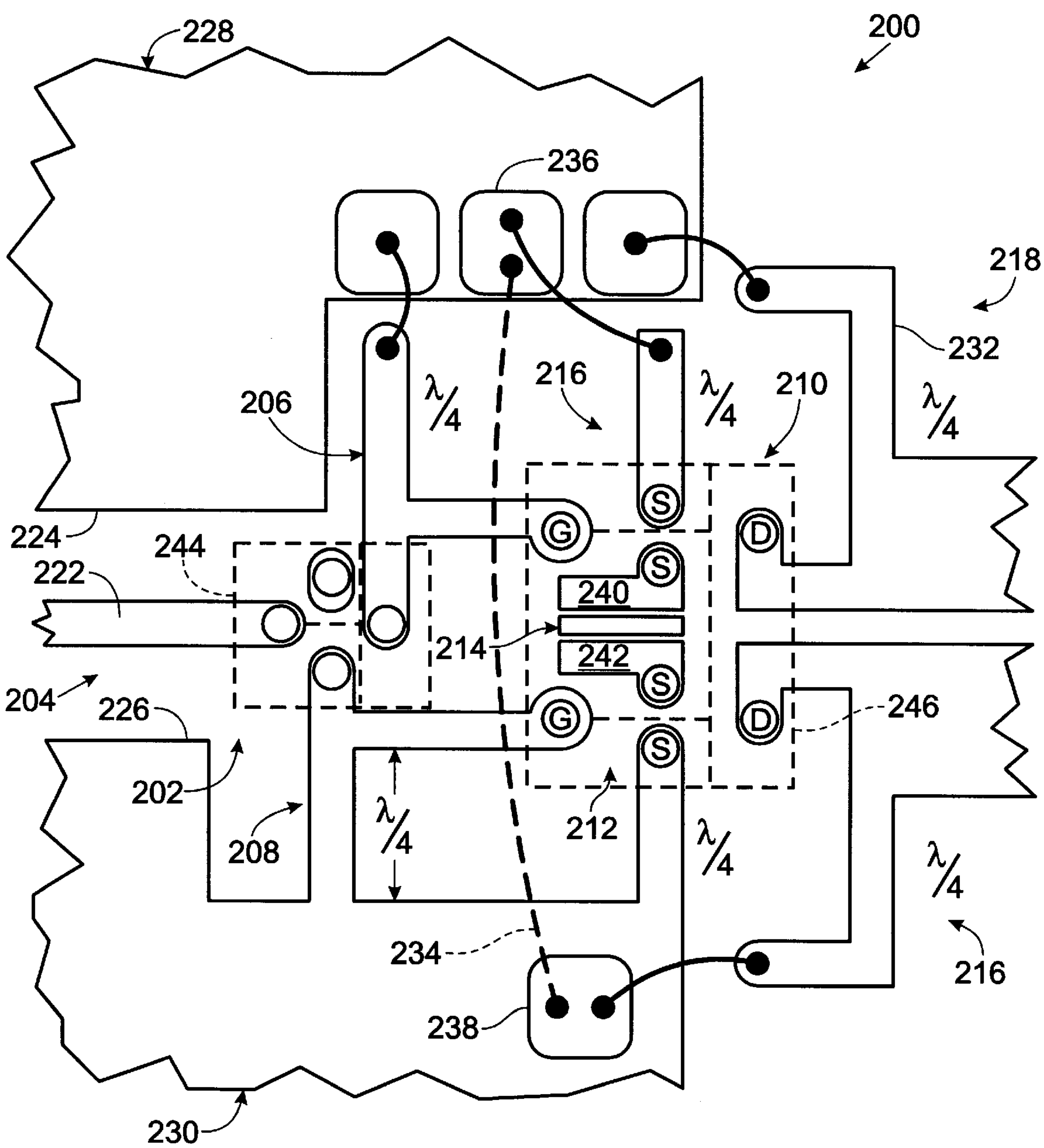
FIG. 12 is a plan view of an embodiment of the circuit of FIG. 11.

FIG. 12 illustrates a preferred embodiment of launch 200. CPW 204 includes a central, signal conductor 222 and ground conductors 224, 226. The ground conductors are formed on respective metalizations 228, 230. The inductors are variously provided by quarter-wavelength transmission lines, such as line 232 forming inductor 218. A conductor 234, represented as a dashed line, extends between pads 236, 238 to provide coupling between the source of FET 210 and the drain of FET 212. Capacitor 214, which may be a standup ceramic element, is provided between spaced conductor portions 240, 242. FET 202 is represented by a chip 244, and FETs 210, 212 are represented by a separate chip 246, although FETs 202, 210, 212 could be formed as a single chip. Both chips are shown in dashed outline.

Figure 13:
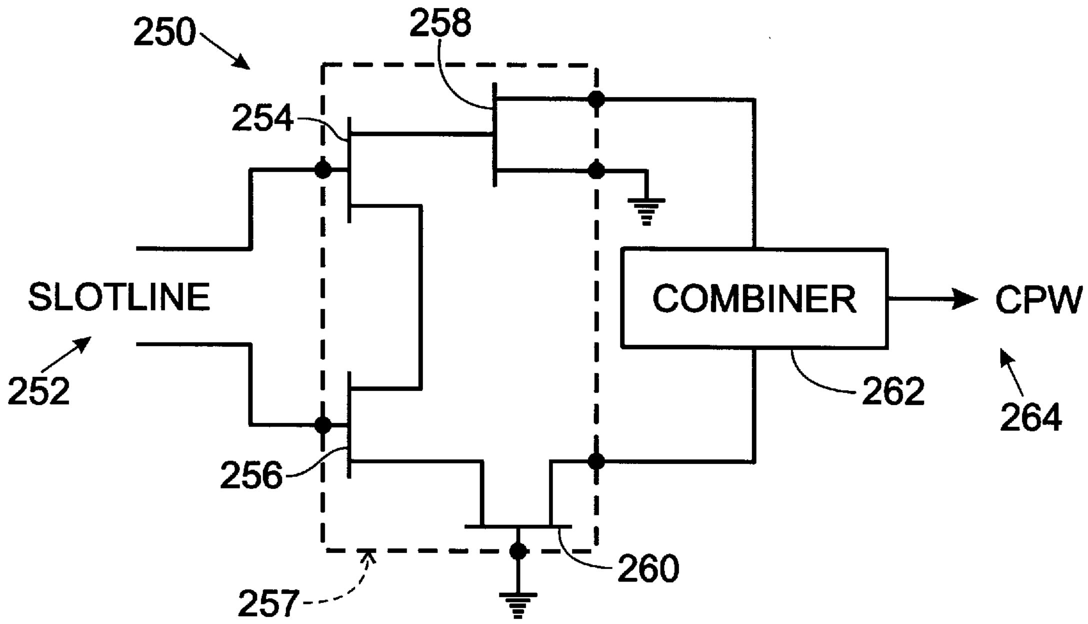
FIG. 13 is a general schematic of an embodiment of FIG. 6 with active phase shifting.

FIG. 13 illustrates in schematic form an active embodiment 250 of the slotline-to-CPW launch of FIG. 6. Launch 250 includes an input slotline 252 having conductors input on the gates of two source-connected FETs 254, 256 of a chip 257. The drain of FET 254 is coupled to the gate of a common-source FET 258. The drain of FET 256 is coupled to the source of a common-gate FET 260. The common-source FET applies a 180° phase shift to the signal, and the common-gate FET does not change the phase of the associated signal. The two signals output from FETs 258 and 260 are in phase. They are combined in a combiner 262 for output on a CPW 264.

Figure 14:
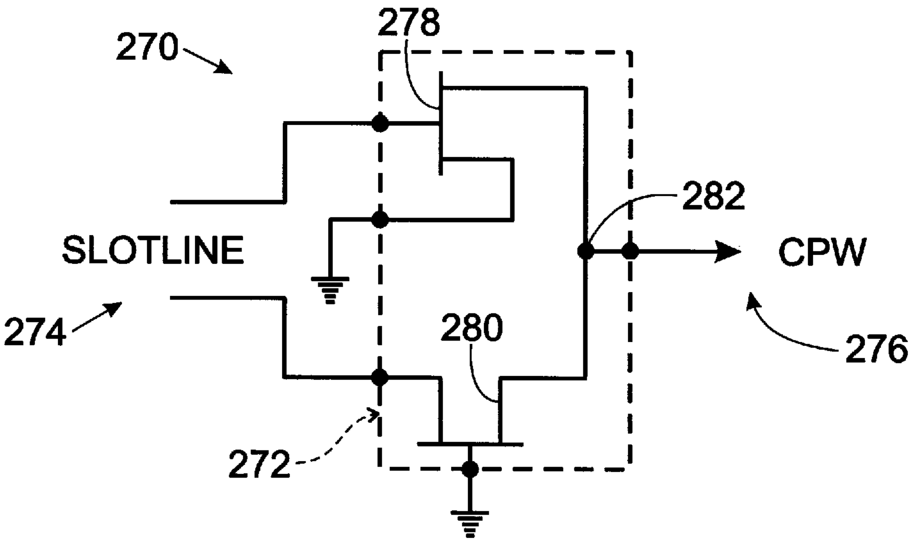
FIG. 14 is a general schematic of an embodiment similar to FIG. 13.

Finally, FIG. 14 illustrates in schematic form a simplified version of the circuit of FIG. 13. An active launch 270 includes an active device 272, shown as a chip in outline form, for converting an input slotline 274 to an output CPW 276. Device 272 includes only a common source FET 278 having a gate coupled to one slotline conductor, and a common gate FET 280 having a source coupled to the other slotline conductor. The drains of these FETs are joined at a connection 282 to provide a common output coupled to the signal conductor of CPW 276, as shown. Connection 282 thus functions as a combiner circuit like combiner 262 shown in FIG. 13.

Several embodiments are shown for converting actively between a slotline and a CPW. These embodiments provide effective conversion between the two traveling wave modes in reduced space with accommodation of impedance and the possible addition of gain. The invention thus makes coplanar circuits having both slotline and CPW portions more readily realizable.

Mixers also can be structured to use both CPW and slotlines to gain orthogonality of signals, and thereby bring the traveling waves to a common type. Conversion between slotline and CPW is inherent in this structure. An oscillator having one or several CPW outputs and a slotline resonator can also be structured. A push-pull oscillator could use the slotline for the gate circuit and the drain circuits could be connected together with a CPW, thereby producing the second harmonic on the drain circuit (push-push connection).

The slotlines and coplanar waveguides described may have semi-infinite conductors, strips that are less than $\lambda/4$ wide at the operating frequencies, or narrow push-pull lines that are nearly equal to the space between them, i.e., have equal space and trace widths. The variety of embodiments illustrated is representative of the different structures that may be realized with an active slotline/CPW launch. Other embodiments will also be apparent to one skilled in the art, the actual structure depending upon the application involved.

Thus, although the present invention has been described in detail with reference to a particular preferred embodiment, persons possessing ordinary skill in the art to which this invention pertains will appreciate that various modifications and enhancements may be made without departing from the spirit and scope of the claims that follow. The above disclosures are intended to educate the reader about a preferred embodiment, and are not intended to constrain the limits of the invention or the scope of the claims.

What is claimed is:

1. An apparatus for converting transmission of electrical signals between a slotline and a coplanar waveguide comprising:

an insulating substrate having a planar face;

a slotline consisting of first and second opposing coplanar conductors mounted on said face of said substrate;

a dual coplanar waveguide structure mounted on said face of said substrate and having first and second spaced-apart center conductors and first and second coplanar ground conductors, said first and second center conductors being positioned between said first and second ground conductors, said coplanar waveguide having a proximal portion adjacent to said slotline, and active device means mounted adjacent to the substrate and having first and second input terminals coupled respectively to said first and second center conductors, first and second output terminals coupled to said opposing conductors, and a common terminal coupled to said first ground conductor, said active device means coupling a signal between said slotline and said coplanar waveguide structure.

2. An apparatus according to claim 1 further comprising means for changing the phase of a signal input on said first input terminal.

3. An apparatus according to claim 2 further comprising a third coplanar waveguide having a third center conductor, and wherein said phase-changing means comprises a first transistor having a control terminal coupled to said third center conductor and first and second current-carrying terminals connected, respectively, to said first and second center conductors.

4. An apparatus according to claim 3 wherein said active device means comprises second and third transistors.

5. An apparatus according to claim 4 wherein said second and third transistors are connected in DC series.

6. An apparatus according to claim 2 wherein said active device means includes said phase-changing means.

7. An apparatus according to claim 1 wherein said active device means is flip mounted onto at least one of said slotline and said coplanar waveguide structure.

8. An apparatus according to claim 7 wherein said active device means is flip mounted onto both said slotline and said coplanar waveguide structure.

9. An apparatus for converting transmission of electrical signals between a slotline and a coplanar waveguide comprising:

an insulating substrate having a planar face;

a slotline consisting of first and second opposing coplanar conductors mounted on said face of said substrate;

a dual coplanar waveguide structure mounted on said face of said substrate and having first and second spaced-apart center conductors and first and second coplanar ground conductors, said first and second center conductors being positioned between said first and second ground conductors, said coplanar waveguide having a proximal portion adjacent to said slotline, and active device means mounted adjacent to the substrate and having first and second input terminals coupled respectively, to respective ones of said opposing conductors, and first and second output terminals coupled to respective ones of said first and second center conductors, and a common terminal coupled to said first ground conductor, said active device means coupling a signal between said slotline and said coplanar waveguide structure.

10. An apparatus according to claim 9 further comprising means for changing the phase of a signal output on said first center conductor.

11. An apparatus according to claim 10 wherein said phase-changing means comprises a first transistor having a control terminal coupled to said first output terminal and a current-carrying terminal connected to said first center conductor, and a second transistor having a first current-carrying terminal connected to said second output terminal and a second current-carrying terminal connected to said second center conductor.

12. An apparatus according to claim 11 wherein said active device means comprises third and fourth transistors.

13. An apparatus according to claim 10 wherein said active device means includes said phase-changing means.

14. An apparatus according to claim 9 wherein said active device means is flip mounted onto at least one of said slotline and said coplanar waveguide structure.

15. An apparatus according to claim 14 wherein said active device means is flip mounted onto both said slotline and said coplanar waveguide structure.

16. An apparatus according to claim 9 wherein said active device means comprises a first transistor having a control terminal coupled to said first input terminal and a current-carrying terminal connected to said first output terminal, and a second transistor having a first current-carrying terminal connected to said second input terminal and a second current-carrying terminal connected to said second output terminal.

17. An apparatus for converting transmission of microwave or millimeter wave signals from a coplanar waveguide to a slotline comprising:

an insulating substrate having a planar face;

a slotline consisting of first and second opposing coplanar conductors mounted on said face of said substrate;

a coplanar waveguide having a center conductor and first and second coplanar ground conductors also mounted on said face of said substrate;

a first active device means having an input terminal coupled to said center conductor, and first and second output terminals; and a second active device means having first and second input terminals coupled respectively to said first and second output terminals of said first active device means, and first and second output terminals coupled individually to said opposing conductors.

18. An apparatus according to claim 17 wherein said first active device means comprises a first field effect transistor, and said second active device means comprises second and third field effect transistors, the sources of said second and third field effect transistors being coupled together.

19. An apparatus according to claim 18 further comprising first biasing means for biasing said first field effect transistor, second biasing means for biasing said second and third field effect transistors, and direct current blocking means disposed between said first field effect transistor and said second and third field effect transistors.

20. An apparatus according to claim 18 wherein said second and third field effect transistors are connected in direct-current series, said apparatus further comprising first biasing means for biasing said first field effect transistor and second biasing means for biasing said second and third field effect transistors.

21. An apparatus according to claim 20 further comprising direct current blocking means disposed between said sources of said second and third field effect transistors.

* * * * *